US011655542B2

(12) United States Patent
Beane et al.

(10) Patent No.: US 11,655,542 B2
(45) Date of Patent: May 23, 2023

(54) ATOMIC LAYER DEPOSITION SYSTEM

(71) Applicant: Carpe Diem Technologies, Inc., Franklin, MA (US)

(72) Inventors: Daniel Beane, Norfolk, MA (US); John S. Berg, Mattapoisett, MA (US); Dimitur Benchev, Norwood, MA (US)

(*) Notice: Subject to any disclaimer, the term of this patent is extended or adjusted under 35 U.S.C. 154(b) by 162 days.

(21) Appl. No.: 17/105,261

(22) Filed: Nov. 25, 2020

(65) Prior Publication Data

US 2021/0156032 A1 May 27, 2021

Related U.S. Application Data

(60) Provisional application No. 62/940,505, filed on Nov. 26, 2019.

(51) Int. Cl.
*C23C 16/54* (2006.01)
*C23C 16/455* (2006.01)
*C23C 16/458* (2006.01)

(52) U.S. Cl.
CPC ......... *C23C 16/545* (2013.01); *C23C 16/458* (2013.01); *C23C 16/4557* (2013.01); *C23C 16/45544* (2013.01); *C23C 16/45578* (2013.01)

(58) Field of Classification Search
None
See application file for complete search history.

(56) References Cited

U.S. PATENT DOCUMENTS

| 4,692,233 | A | * | 9/1987 | Casey | C23C 14/562 |
| | | | | | 204/192.12 |
| 6,082,292 | A | * | 7/2000 | Denes | B29C 59/14 |
| | | | | | 118/729 |
| 9,297,077 | B2 | | 3/2016 | Vermeer et al. | |
| 9,803,280 | B2 | | 10/2017 | Vermeer et al. | |
| 10,351,954 | B2 | | 7/2019 | Levy | |
| 2009/0229520 | A1 | | 9/2009 | Fujinami et al. | |
| 2010/0266766 | A1 | * | 10/2010 | Hein | C23C 16/545 |
| | | | | | 118/729 |
| 2012/0301615 | A1 | * | 11/2012 | Honda | C23C 14/564 |
| | | | | | 118/724 |
| 2013/0064977 | A1 | * | 3/2013 | Vermeer | C23C 16/45563 |
| | | | | | 427/248.1 |
| 2015/0096495 | A1 | | 4/2015 | Jeong | |

(Continued)

*Primary Examiner* — Karla A Moore
(74) *Attorney, Agent, or Firm* — Kriegsman & Kriegsman

(57) ABSTRACT

An atomic layer deposition system for depositing thin layers of material onto a common substrate includes a deposition head shaped to define a conical interior cavity into which a conical deposition drum is disposed. Together, the deposition head and the deposition drum define a narrow gap adapted to receive the common substrate, the spacing of the narrow gap being adjustable through acute axial displacement of the deposition head relative to the deposition drum. A pair of rollers advances the substrate through the gap in a first direction, as the deposition head rotates in the opposite direction at a precise rate. Each of the deposition head and deposition drum includes a plurality of separate fluid channels which enable gasses utilized in the deposition process to be delivered into and exhausted from the narrow gap, with the delivery of inert gas on both sides of the substrate effectively creating an air bearing.

18 Claims, 9 Drawing Sheets

(56) References Cited

U.S. PATENT DOCUMENTS

| | | | |
|---|---|---|---|
| 2015/0152552 A1* | 6/2015 | Enholm | ............ C23C 16/45563 |
| | | | 118/728 |
| 2015/0179986 A1 | 6/2015 | Yan et al. | |
| 2016/0273105 A1 | 9/2016 | de Ridder et al. | |
| 2018/0251896 A1 | 9/2018 | Jauhiainen et al. | |

* cited by examiner

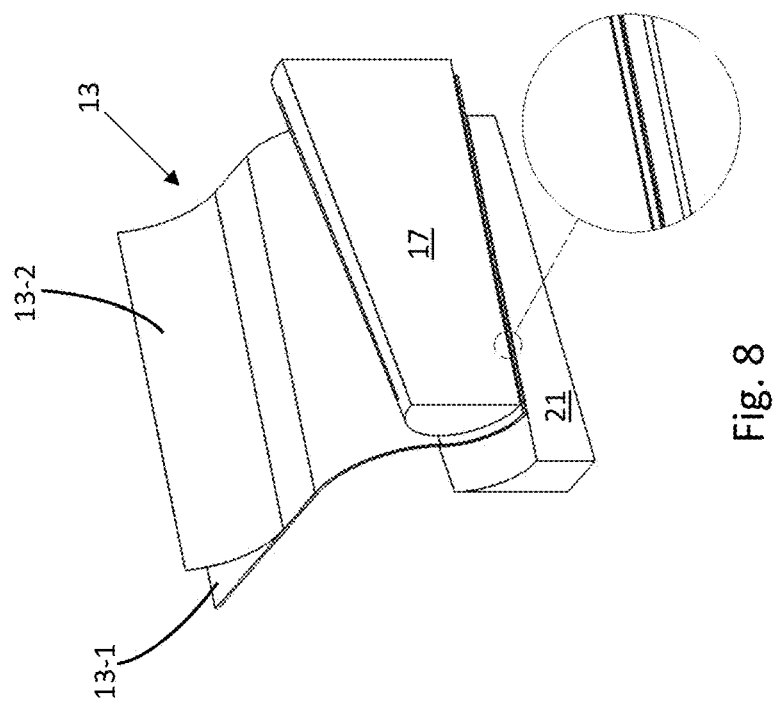
Fig. 8
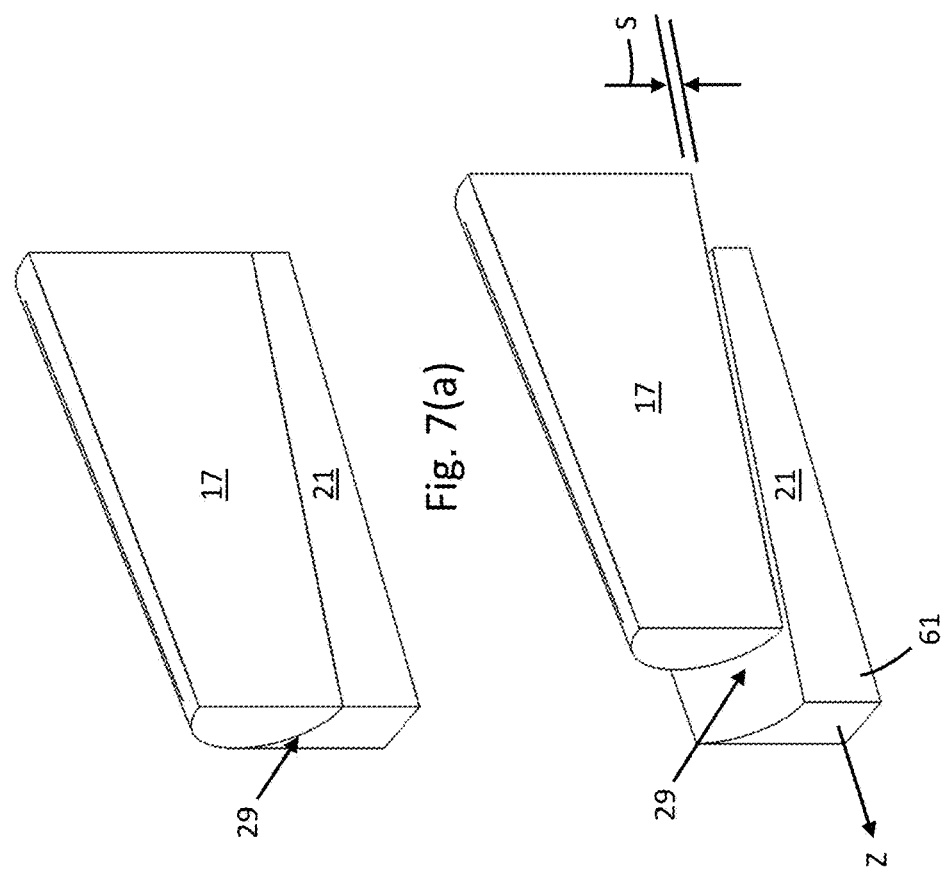
Fig. 7(a)
Fig. 7(b)

ATOMIC LAYER DEPOSITION SYSTEM

CROSS-REFERENCE TO RELATED APPLICATIONS

The present application claims the benefit under 35 U.S.C. 119(e) to U.S. Provisional Patent Application No. 62/940,505, which was filed on Nov. 26, 2019 in the names of Daniel Beane et al., the disclosure of which is incorporated herein by reference.

FIELD OF THE INVENTION

The present invention relates generally to thin film deposition techniques and, more particularly, to the deposition of thin films through atomic layer deposition.

BACKGROUND OF THE INVENTION

Atomic layer deposition (ALD) is a well-known technique for constructing thin films on a deposition substrate. Because atomic layer deposition allows for the construction of highly precise, atomic-level layers on a substrate, ALD is commonly utilized in the fabrication of thin-film semiconductor devices.

Atomic layer deposition is a chemical process, typically performed within a reaction chamber, which involves sequentially exposing a surface with alternate gaseous species, or precursors. More specifically, a first precursor is exposed to the surface of a substrate. Due to its inherent properties, the first precursor reacts with and is absorbed onto the surface of the substrate but does not react with the other first precursor molecules. As a result, a thin, uniform, atomic-level layer of the first precursor is grown on the substrate surface.

Thereafter, any excess of the first precursor is removed from the reaction chamber and a second precursor is exposed to the surface. The second precursor reacts with the first precursor without reacting to any of the other second precursor molecules. In this manner, a second, uniform, atomic-level layer of the second precursor is grown directly upon the first layer formed from the first precursor.

The specific type and number of different precursors utilized in atomic layer deposition can vary based on the intended application. A single ALD cycle is considered complete when each precursor is exposed once onto the designated surface. Therefore, through the application of a specific number of ALD cycles, a uniform and highly precise material thickness can be achieved on a substrate.

Atomic layer deposition is commonly performed using an atomic layer deposition system which includes an enclosable reaction chamber in which is situated (i) feed-in and take-up reels for high-speed advancement of a continuous thin-film substrate, or web, and (ii) a deposition drum and a deposition head which together define a narrow gap into which the thin-film substrate is advanced and, in turn, applied with precursors during the layer deposition process. Examples of ALD systems of the type as described above are shown in U.S. Pat. No. 10,351,954 to D. H. Levy, U.S. Pat. No. 9,297,077 to A. J. P. M. Vermeer et al., and U.S. Pat. No. 9,803,280 to A. J. P. M. Vermeer et al., the disclosures of each being incorporated herein by reference.

Conventional ALD systems of the type described above often rely upon the delivery of two or more precursors as a series of sequential, non-overlapping stages. In other words, as the continuous web is advanced, a portion of the web is applied with a first precursor and then subsequently applied with a second precursor at a separate downstream location as the web is transported. To create a chemical buffer, an inert gas is preferably exposed onto the web between the separate precursor application processes (i.e. to prevent any chemical reaction between precursors within the reaction chamber other than on the continuous web).

Although well known in the art, ALD systems of the type described above have been found to suffer certain shortcomings. Notably, the deposition head and drum are typically held fixed in relation to one another so as to define a fixed-sized gap therebetween that is dimensioned to receive the continuous web. The size of the gap is typically minimized to the greatest extent possible to prevent web undulation, limit excess precursor application, and, most critically, to prevent mixing of the reactive, often pyrophoric, gases past the return flow and the buffer gas However, at the same time, the gap requires spacing which is adequate enough so as not to restrict web travel nor touching of the web as it traverses the low pressure return path.

Applicant has recognized that the fixed-sized nature of the gap between the deposition head and drum renders conventional ALD systems incapable of accommodating for variances in substrate thickness nor adjustability to tune the gas flows. Because variances in web thickness often arise due to differences in intended applications, conventional ALD systems which separate the deposition of gas either in time or space have all been found to be largely inadequate.

Additionally, applicant has recognized that the quality and rate of atomic layer deposition reaction is substantially dependent upon temperature at the reactant site. Minimum temperatures of the reactants at the reactant site must be maintained in order to produce the target molecule-sized deposition layers and to avoid condensing the precursors prior to reaction on the substrate. However, minimum reactant temperatures may exceed the temperature tolerance of the target substrate, particularly for webs constructed of polymers with glass transition temperatures that fall below the required minimum reaction temperatures. As a result, precursor materials utilized in atomic layer deposition are often restricted to materials which can be suitably applied at a temperature that falls beneath the temperature damage threshold for the target substrate or target substrates are restricted to those which survive the required deposition temperatures of the reactants.

SUMMARY OF THE INVENTION

In view thereof, it is an object of the present invention to provide a novel atomic layer deposition (ALD) system.

It is another object of the present invention to provide an ALD system which is uniquely designed to deposit thin layers of material onto a common substrate at relatively high speeds and with considerable precision.

It is yet another object of the present invention to provide an ALD system of the type as described above which is designed to accommodate substrates of varying thicknesses.

It is still another object of the present invention to provide an ALD system of the type as described above which is designed to regulate temperature at the reactant site in order to ensure proper reactant deposition without damaging the substrate.

Accordingly, as one feature of the present invention, there is provided a system for depositing atomic-level layers of material onto a common substrate, the system comprising (a) a deposition drum having a longitudinal axis, the deposition drum adapted to rotate about the longitudinal axis, and (b) a deposition head shaped to define an interior cavity into which the deposition drum is positioned, the deposition head being spaced away from the deposition drum so as to define a narrow gap therebetween, the narrow gap being adapted to receive the common substrate, (c) wherein the narrow gap has a spacing which is adjustable.

Various other features and advantages will appear from the description to follow. In the description, reference is made to the accompanying drawings which form a part thereof, and in which is shown by way of illustration, an embodiment for practicing the invention. The embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings, wherein like reference numerals represent like parts:

FIGS. 7(a) and 7(b) are simplified, longitudinal cross-sectional views of the deposition drum and a portion of the lower shell of the deposition head, the deposition drum being shown at multiple axial positions relative to the deposition head to illustrate the gap adjustability feature of the present invention;

FIG. 8 is a simplified, longitudinal cross-sectional view of the deposition drum and the portion of the deposition head shown in FIG. 7(b), the deposition drum and head being shown with a continuous web advanced into the gap defined therebetween;

DETAILED DESCRIPTION OF THE INVENTION

Atomic Layer Deposition (ALD) System 11

Figure 1:
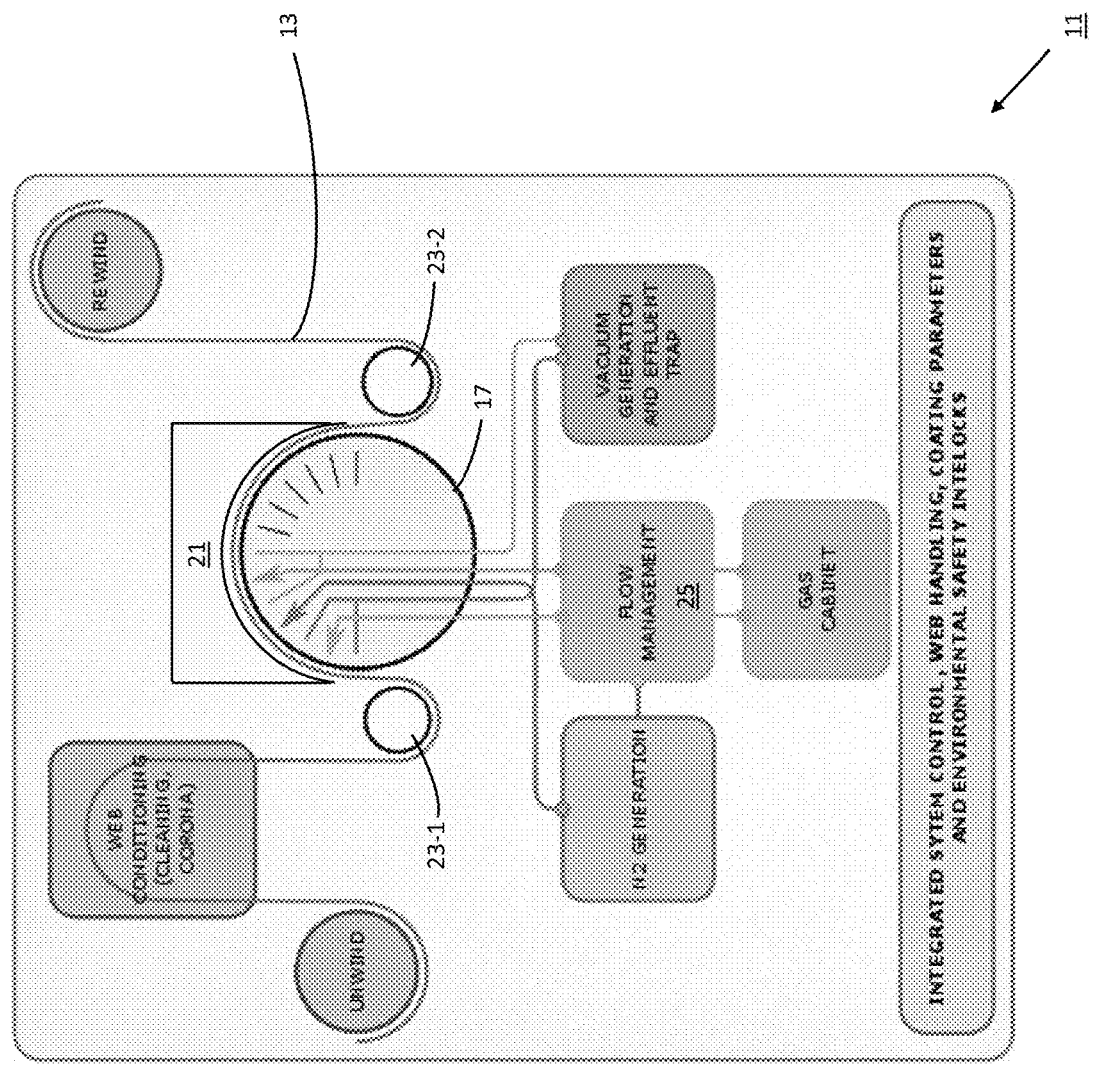
FIG. 1 is simplified schematic representation of an atomic layer deposition (ALD) system constructed according to the teachings of the present invention, the system being shown with a web-like substrate fed thereinto.

Referring now to FIG. 1, there is shown a simplified schematic representation of an atomic layer deposition (ALD) system which is constructed according to the teachings of the present invention, the ALD system being defined generally by reference numeral 11. As will be explained in detail below, system 11 is uniquely designed to deposit thin layers of precursor material onto a common substrate 13 at relatively high speeds and with considerable precision.

As defined herein, the term "substrate" denotes any surface or material which is suitable for receiving deposition layers. In the description that follows, substrate 13 is represented as an elongated web of material, thereby enabling layer deposition processes to be applied continuously at relatively high speeds. However, it is to be understood that substrate 13 could be represented in alternative forms without departing from the spirit of the present invention.

Figure 2:
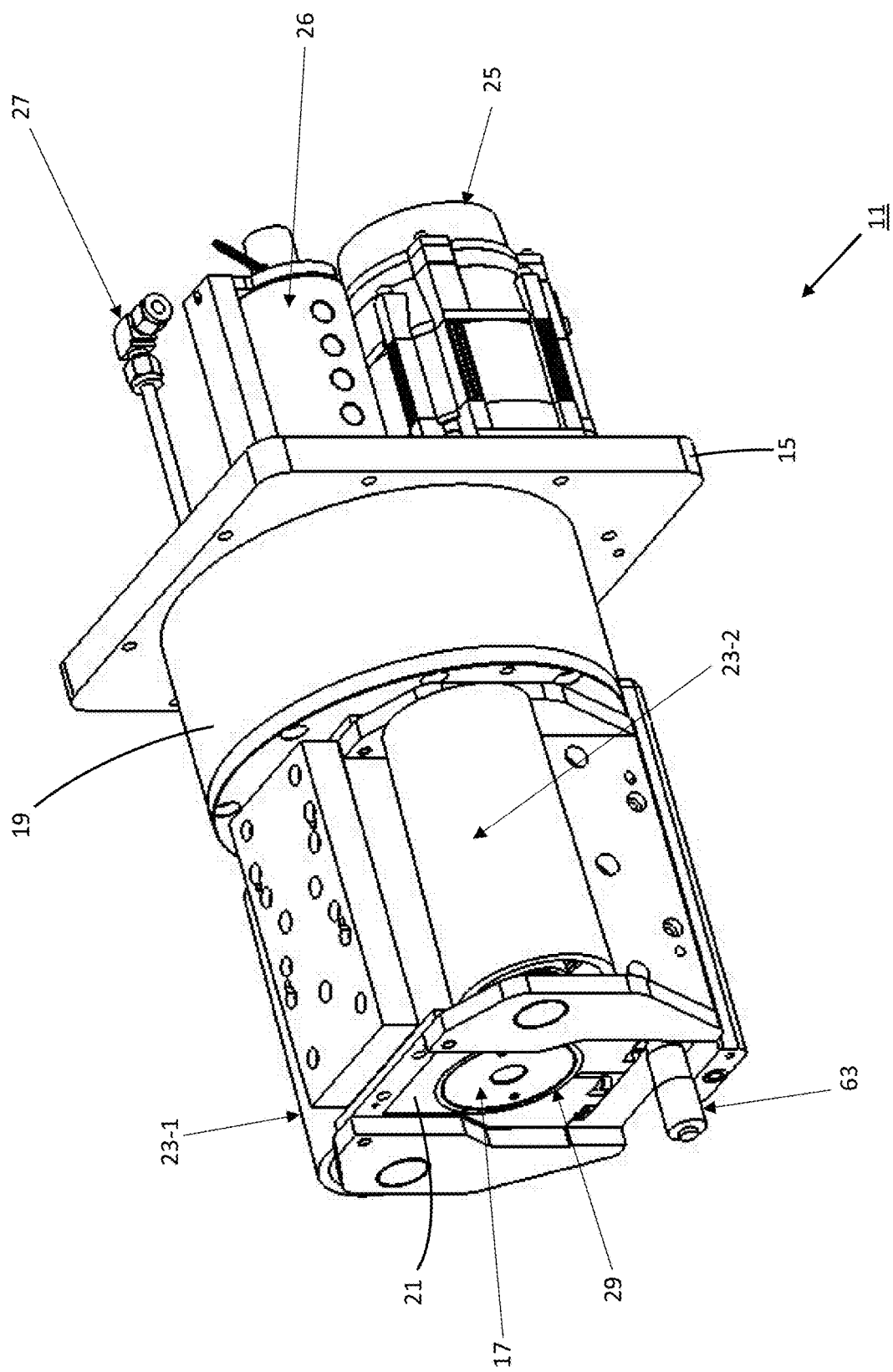
FIG. 2 is a top perspective view of selected components of the ALD system shown in FIG. 1.
Figure 3:
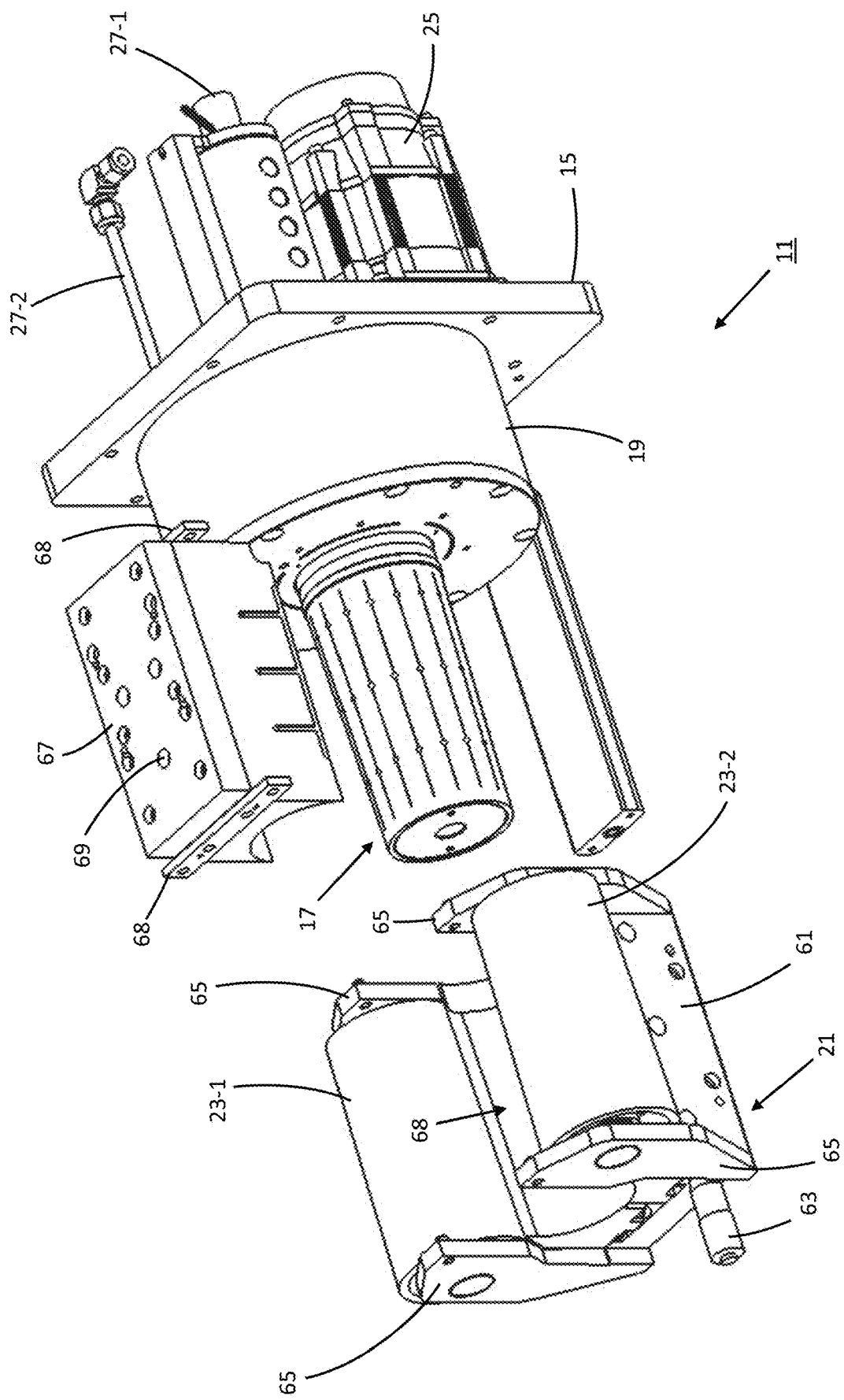
FIG. 3 is an exploded, top perspective view of the components shown in FIG. 2.
Figure 4:
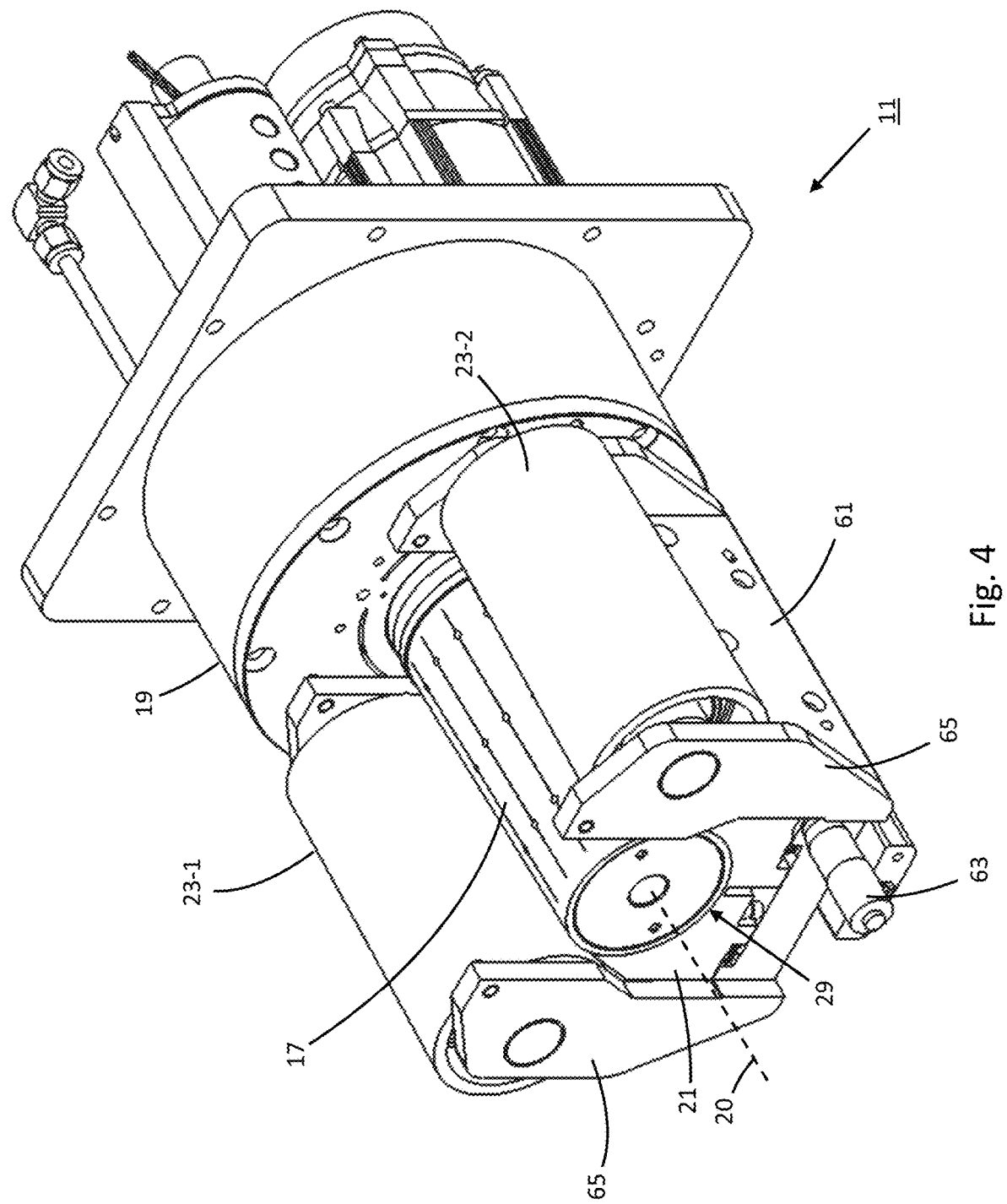
FIG. 4 is a top perspective view of the selected components shown in FIG. 2, the upper shell for the deposition head being shown removed therefrom to illustrate certain features of the deposition drum.

Referring now to FIGS. 2-4, the principal mechanical components of ALD system 11 are shown in greater detail. As seen most clearly in FIG. 3, ALD system 11 comprises, among other things, (i) a fixed mount, or support, 15, (ii) a deposition drum 17, which is rotatably driven and fixedly secured to mount 15 by a bearing and ring gear assembly 19, (iii) a multi-piece shell, or deposition head, 21 which is fixedly secured to mount 15 and which substantially circumscribes, or encloses, drum 17, (iv) input and output rollers 23-1 and 23-2, which are fixedly coupled to shell 21 on opposing sides of drum 17, for advancing substrate, or web, 13 through the deposition process, (v) a motor 25 for rotatably driving drum 17 via bearing and ring gear assembly 19, (vi) a precursor supply manifold 26 mounted on support 15 in fluid communication with drum 17 for delivering the various precursors used in the atomic layer deposition process, and (vii) exhaust outlets 27 in fluid communication with drum 17 and head 21, respectively, for exhausting gases utilized in the deposition process, with additional exhaust outlets additionally provided by manifold 26. Ideally, the aforementioned components are housed within a common chamber and may include additional components for pre-treating, post-treating and/or collecting substrate 13.

As noted above, deposition head 21 circumscribes deposition drum 17 in a spaced relationship relative thereto so as to define a narrow gap 29 therebetween. Gap 29 is appropriately dimensioned to receive and handle web 13 during the layer deposition process. As a principal feature of the present invention, ALD system 11 is designed such that the dimension (i.e. spacing) of gap 29 can be easily adjusted, thereby enabling system 11 to accommodate substrates of varying thicknesses.

Deposition Drum 17

Figure 5:
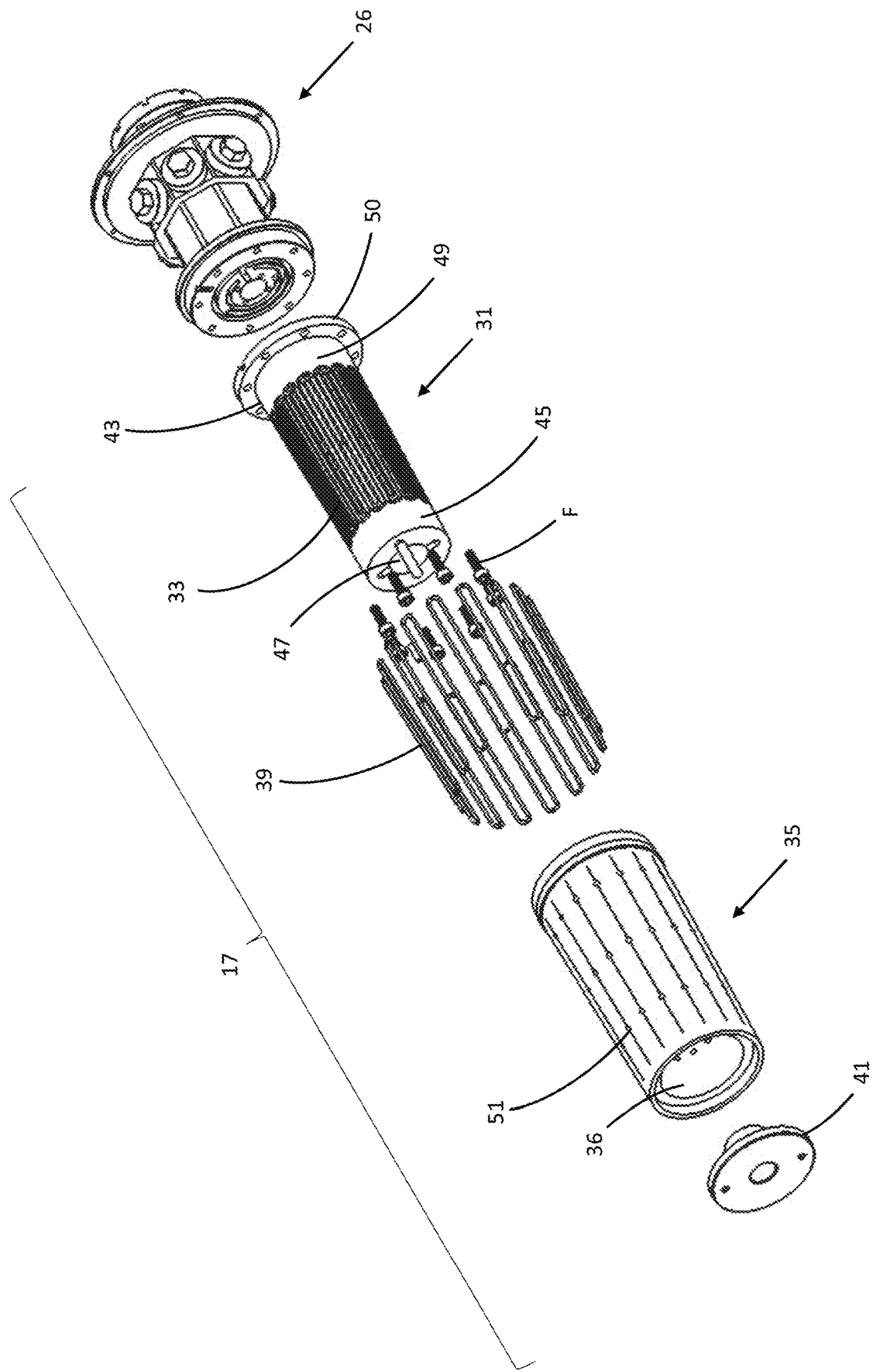
FIG. 5 is an exploded, top perspective view of the deposition drum and precursor manifold shown in FIG. 4.
Figure 6:
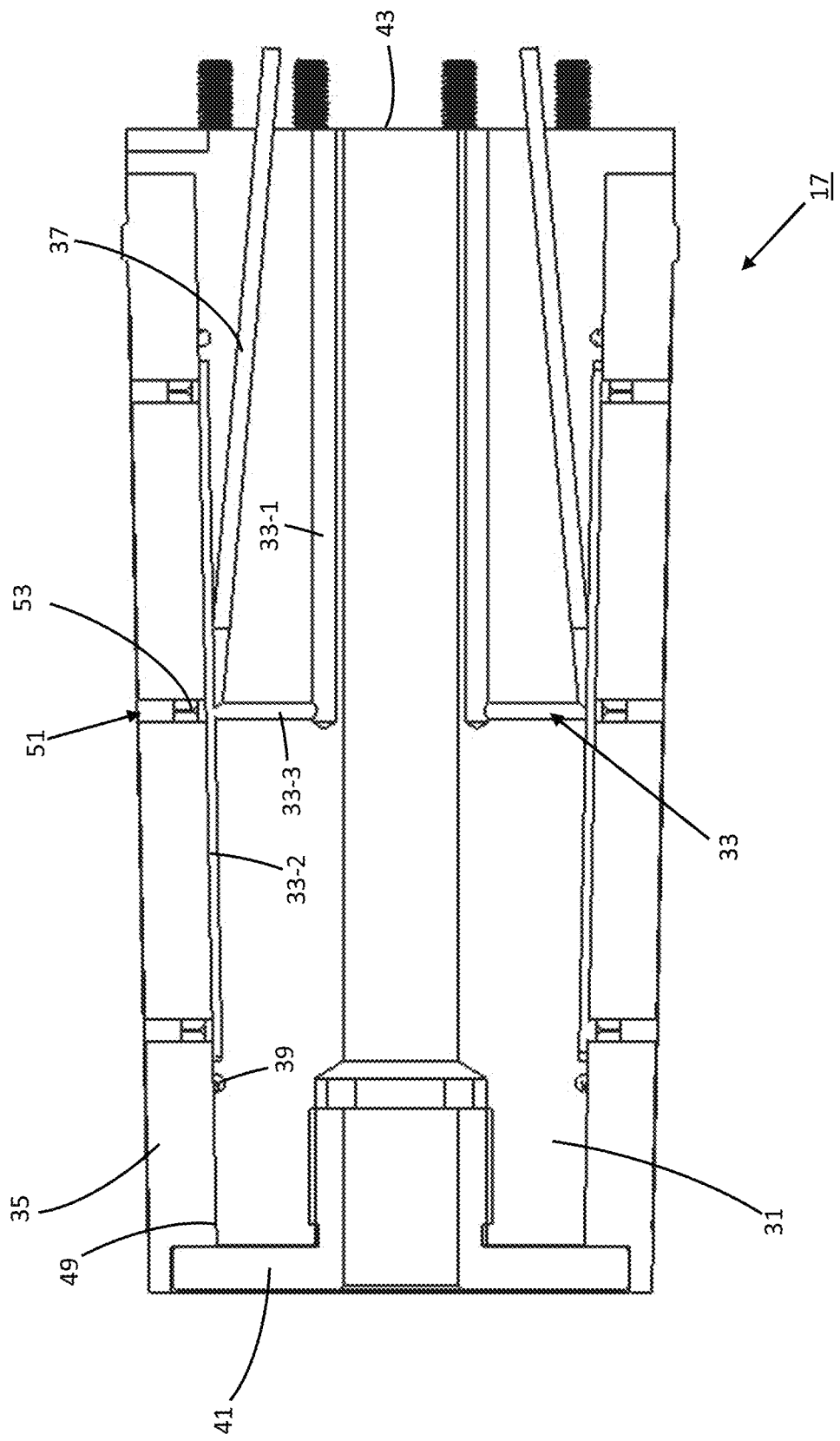
FIG. 6 is a longitudinal cross-sectional view of the deposition drum shown in FIG. 4.

Referring now to FIGS. 4-6, deposition drum 17 is a slightly conical component which is driven by motor 19 to rotate about its longitudinal, or rotational, axis 20. As will be explained further below, deposition drum 17 is provided with a series of separate fluid channels which are designed to either deliver or exhaust fluids utilized in the atomic layer deposition process.

As seen most clearly in FIGS. 5 and 6, drum 17 comprises (i) a conical drum core 31 which is provided with a network of separate fluid channels 33, (ii) a hollow, conical sleeve 35 with mating interior conical surface 36 coaxially mounted over drum core 31, (iii) a heat source 37 mounted within core 31 in communication with each of fluid channels 33, (iv) a plurality of O-rings, or gaskets, 39 disposed between core 31 and sleeve 35 for creating fluid isolation between channels 33, and (v) a retention cap 41 for securing sleeve 35 in position on core 31. As can be appreciated, the multi-piece construction of deposition drum 17 permits disassembly, as needed, for cleaning or other similar types of maintenance.

Drum core 31 is constructed as a hollow, generally conical component which includes a widened rear end 43, a narrowed front end 45, an inner surface 47, and an outer surface 49. Additionally, a radial flange 50 is formed on rear end 43 to facilitate connection of drum 17 onto a mount for distribution manifold 26, which is located within the cover for bearing and ring gear assembly 19, using fasteners F.

As noted briefly above, drum core 31 is provided with a network of separate fluid channels 33. As seen most clearly in FIG. 6, each channel 33 includes (i) an internal longitudinal segment 33-1 which exits widened rear end 43, (ii) an external longitudinal segment, or groove, 33-2 that is formed in outer surface 49, and (iii) a radial segment 33-3 connecting internal segment 33-1 to external segment 33-2. In this capacity, an internal fluid path is established within drum core 31 that terminates, at one end, out through rear end 43 and terminates, at the opposite end, out through outer surface 49.

Sleeve 35 is similarly provided with an array of radial orifices 51, with an insert, or valve, 53 disposed sub-flush within each orifice 51 for regulating fluid flow. The array of orifices 51 is configured into sets of three co-linear orifices 51, as seen in FIG. 5, with the plurality of sets arranged about the periphery of sleeve 35 in an equidistantly spaced relationship. Each set of orifices 51 is positioned to align radially with external segment 33-2 of a corresponding fluid channel 33, as seen in FIG. 6, so as to create a continuous fluid path. An O-ring 39 is fittingly disposed into a complementary groove formed in outer surface 49 around each external segment 33-2, thereby creating an external seal around each fluid channel 33.

It should be noted that interior surface 36 of sleeve 35 and outer surface 49 of drum core 31 have matching conical surfaces, as seen most clearly in FIG. 6. This mating conical relationship facilitates the assembly, as well as the disassembly, of sleeve 35 on core 31. Additionally, the mating conical relationship ensures an adequate and uniform seal between sleeve 35 and core 31, which is critical in isolating each fluid channel 33.

As referenced above, a heat source 37 is preferably disposed within core 31 in communication with each of fluid channels 33. For instance, in the present embodiment, heat source 37 is represented as a fiber-coupled laser. However, it is to be understood that alternative types of heat sources (e.g., a heat-producing resistor) could be used in place thereof without departing from the spirit of the present invention.

As can be appreciated, heat source 37 is incorporated into deposition drum 17 in order to produce heat within fluid channels 33 proximate orifices 51. In particular, the generation of heat from drum 17 can be used to eliminate condensate and accelerate without breaking down reactant, thereby improving the quality of layer deposition on substrate 13.

Deposition Head 21

Referring back to FIGS. 3 and 4, multi-piece deposition head 21 is fixedly secured to mount 15 and substantially circumscribes, or encloses, drum 17 in a spaced relationship relative thereto so as to define a narrow gap 29 therebetween. Deposition head 21 comprises (i) a lower shell 61 that is fixedly secured to mount 15, (ii) a micrometer head 63 for fine-tuning axial displacement of lower shell 61 relative to mount 15, (iii) a set of brackets 65 fixedly coupled to opposite ends of lower shell 61, and (iv) an upper shell 67 with fixed opposing brackets 68 that are coupled to brackets 65 with fasteners such that upper shell 67 is disposed directly above lower shell 61. Although fasteners (not shown) are inserted through brackets 65 and 68 to couple together shells 61 and 67, it is to be understood that alternative means of interconnecting shells 61 and 67 could be used in place thereof (e.g., complementary brackets with opposing, releasably engageable surfaces) without departing from the spirit of the present invention.

Upper shell 67 of deposition head 21 is shaped to define a plurality of isolated, transverse, fluid channels 69 which extend vertically therethrough. As will be explained further below, fluid channels 69 allow for the delivery and/or exhausting of gases used in atomic layer deposition processes or in their isolation.

Together lower and upper shells 61 and 67 define a conical cavity 68 that is dimensioned to circumscribe matching conical drum 17 so as to define a uniform narrow gap 29 therebetween. Due to the mounting arrangement of deposition head 21 relative to drum 17 as well as the ability to deliver gas into gap 29 from both inner deposition drum 17 and outer head 21, a well-behaved, rigid air bearing is established. The creation of a rigid air bearing between drum 17 and head 21 enables web-like substrate 13 to maintain the gap 29 (i.e., contact neither drum 17 nor head 21). Furthermore, a minimal air bearing gap is required to allow a pressure differential to restrict and direct the flow of the gas to prevent catastrophic gas mixing. As a result, any deformation of web 13 is minimized to the greatest extent possible. Additionally, the floating of web 13 renders the utilization of precursors during deposition more efficient and well controlled.

It should be noted that the conical taper for each of cavity 68 and drum 17 is preferably in the range between 0 degrees and 10 degrees relative to longitudinal rotational axis 20 of drum 17. As can be appreciated, a conical taper approaching zero (resulting in a near cylindrical configuration) may be preferable in certain applications due to the relatively small dimensions of gap 29 and the minimal variability in spacing that is typically required to accommodate different substrate thicknesses.

It should also be noted that, although the angle of conical taper for each of cavity 68 and drum 17 is preferably matched so as to yield a gap 29 with uniform spacing, a slight variance in the angle of conical taper between cavity 68 and drum 17 may be permissible, or even advantageous, in certain applications.

Brackets 65 are not only used to couple lower and upper shells 61 and 67, but also to support input and output rollers 23-1 and 23-2. In this manner, rollers 23 are appropriately positioned to transport substrate 13 into gap 29 for atomic layer deposition as well as ensure proper tracking of substrate 13, as will be explained further in detail below.

Gap Adjustability Feature

As a principal feature of the present invention, the construction of deposition drum 17 and head 21 allows for the fixed spacing of gap 29 to be adjusted in order to accommodate substrates of varying thickness. In particular, as seen most clearly in FIGS. 7(a) and 7(b), the conical nature of (i) the exterior surface of drum 17 as well as (ii) the cavity defined between lower and upper shells 61 and 67 of deposition head 21 enables the thickness of gap 29 to be adjusted simply by linearly displacing head 21 relative to drum 17.

Specifically, using micrometer head 63, lower shell 61 can be axially displaced relative to fixed-location drum 17. As lower shell 61 is axially displaced away from fixed drum 17 (i.e., in the direction represented by arrow Z in FIG. 7(b)), the complementary conical surfaces between deposition drum 17 and head 21 cause the spacing S of gap 29 to increase. Conversely, displacing lower shell 61 back towards fixed drum 17 (i.e., in the opposite direction represented by arrow Z in FIG. 7(b)) serves to reduce the spacing of gap 29.

The presence of the aforementioned gap adjustability feature allows for substrates of varying thickness to be used in ALD system 11. For instance, as shown in FIG. 8, gap adjustability allows for substrate 13 to optionally include a stiff, high-temperature backing layer, or carrier sheet, 13-1 in those circumstances when the primary deposition layer 13-2 is constructed of a low stiffness and/or low glass transition temperature (Tg) material.

It should be noted that carrier sheet 13-1 could be directly incorporated into ALD system 11, for example, as a conveyor belt that is designed to deliver and support sensitive substrates through the atomic layer deposition process. In this manner, carrier sheet 13-1 would serve to protect such substrates and thereby expand the scope of potential applications.

Figure 9A:
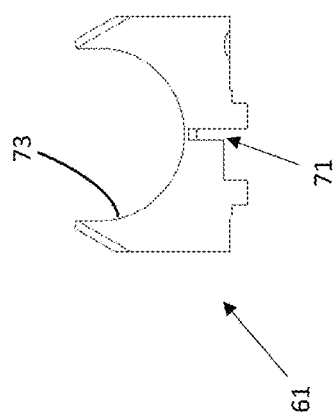
FIGS. 9(a) and 9(b) are front plan and front perspective views, respectively, of the lower shell of the deposition head, the lower shell being shown to illustrate adjustability of the dimensions of its longitudinal arcuate cavity as an additional method for varying the gap size.
Figure 9B:
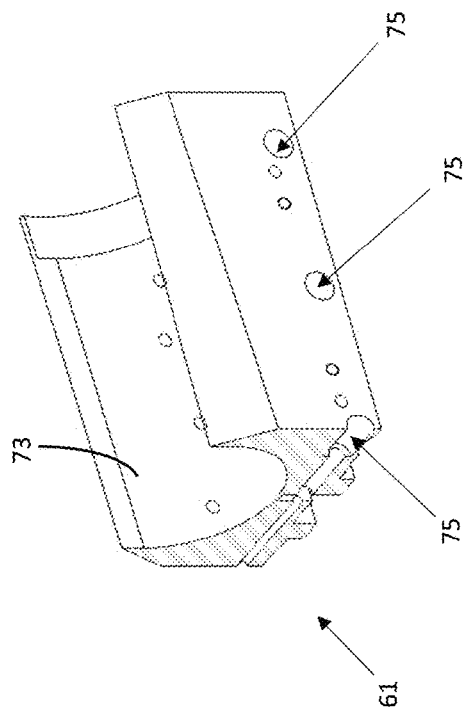

It should be noted that the adjustability of gap 29 could be achieved through alternative means. For instance, referring now to FIGS. 9(a) and 9(b), lower shell 61 is shown with a center relief slot 71 extending longitudinally along its underside. The inclusion of slot 71 enables the radial curvature of recessed top surface 73 to flex slightly upon the application of a suitable expansive or compressive force.

Accordingly, a series of transverse bores 75 is preferably formed in the lower region of lower shell 61 and span across slot 71. A fastening element (not shown), preferably with a coefficient of thermal expansion (CTE) that matches lower shell 61, is axially inserted into each transverse bore 75.

Therefore, tightening of the fastening elements serves to reduce the width of slot 71 and, in turn, expand the width of recessed top surface 73. By contrast, loosening of the fastening elements serves to expand the width of slot 71 and, in turn, contract the width of recessed top surface 73. As such, through adjustment of the fastening elements, the curvature of top surface 73 can be acutely modified, thereby modifying the radius of cavity 68. As a result, the size of gap 29 which is defined between deposition drum 17 and deposition head 21 can be effectively adjusted. It should be noted that modification of the radial curvature of top surface 73 not only adjusts the size of gap 29 but also allows for acute registration of the delivery and exhaustion of gasses into gap 29 as part of the overall substrate fabrication process.

Tracking Feature

The complementary conical geometry of deposition drum 17 and deposition head 21 can introduce tracking, or registration, problems as substrate 13 is advanced through gap 29. To remedy this issue, input and output rollers 23-1 and 23-2 preferably share the same conical configuration as deposition drum 17 but are disposed in the opposing direction.

Figure 10:
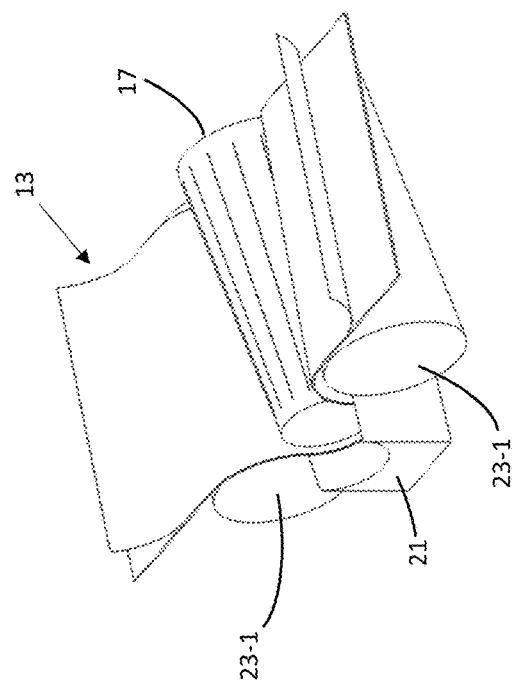
FIG. 10 is a simplified, top perspective view of the deposition drum, lower shell of the deposition head, and continuous web shown in FIG. 8, the input and output rollers being shown additionally to illustrate the proper tracking of the continuous web pair within the adjustable gap.

Specifically, as seen most clearly in FIG. 10, conical rollers 23 are arranged on opposing sides of drum 17 but are oriented in the opposite direction (i.e., with each roller 23 tapering inward from front-to-back as opposed to tapering inward from back-to-front). Therefore, the travel path for web 13 is maintained dimensionally uniform in cross-section, thereby minimizing any risk of misalignment, or improper tracking, of substrate 13 within gap 29.

Ideally, the product of the angle of conical taper for each roller 23 and the wrap angle of web 13 around each roller 23, when summed together for the roller pair, is equal to the product of the angle of conical taper for drum 17 and the wrap angle of web 13 around drum 17. In the present embodiment, matching conical taper angles of approximately 5 degrees for rollers 23 and drum 17 are shown, with a 90-degree wrap angle for each roller 23 and a 180-degree wrap angle for deposition drum 17. Using the above-described formulation, slight variances in the angle of conical taper between each roller 23 and drum 17 can be supported without compromising adequate substrate tracking.

Illustrative Deposition Process

As referenced above, ALD system 11 is designed principally for use in the continuous deposition of thin files onto a designated web-type substrate. The following is one illustrative use of ALD system 11 in the construction of thin films onto a common substrate. It is to be understood that the details below are provided simply to illustrate a potential application for system 11 and is not to be taken in a limiting sense.

Prior to the layer deposition process, the spacing of gap 29 is adjusted and set based primarily upon the thickness of the web-type substrate on which the various thin film layers are to be applied. As set forth in detail above, adjustment of gap 29 can be precisely and simply achieved through actuation of micrometer head 63 which, in turn, axially displaces deposition head 21 relative to deposition drum 17.

Preferably, gap 29 is adjusted so as to create approximately 4 um of spacing on both sides of web-type substrate 13 (i.e., the gap width is calculated by adding 8 um to the thickness of the designated substrate). As noted above, precise adjustment of fixed gap 29 provides numerous functional advantages including, but not limited to, efficient precursor usage as well as minimal deformation of web 13.

Figure 11:
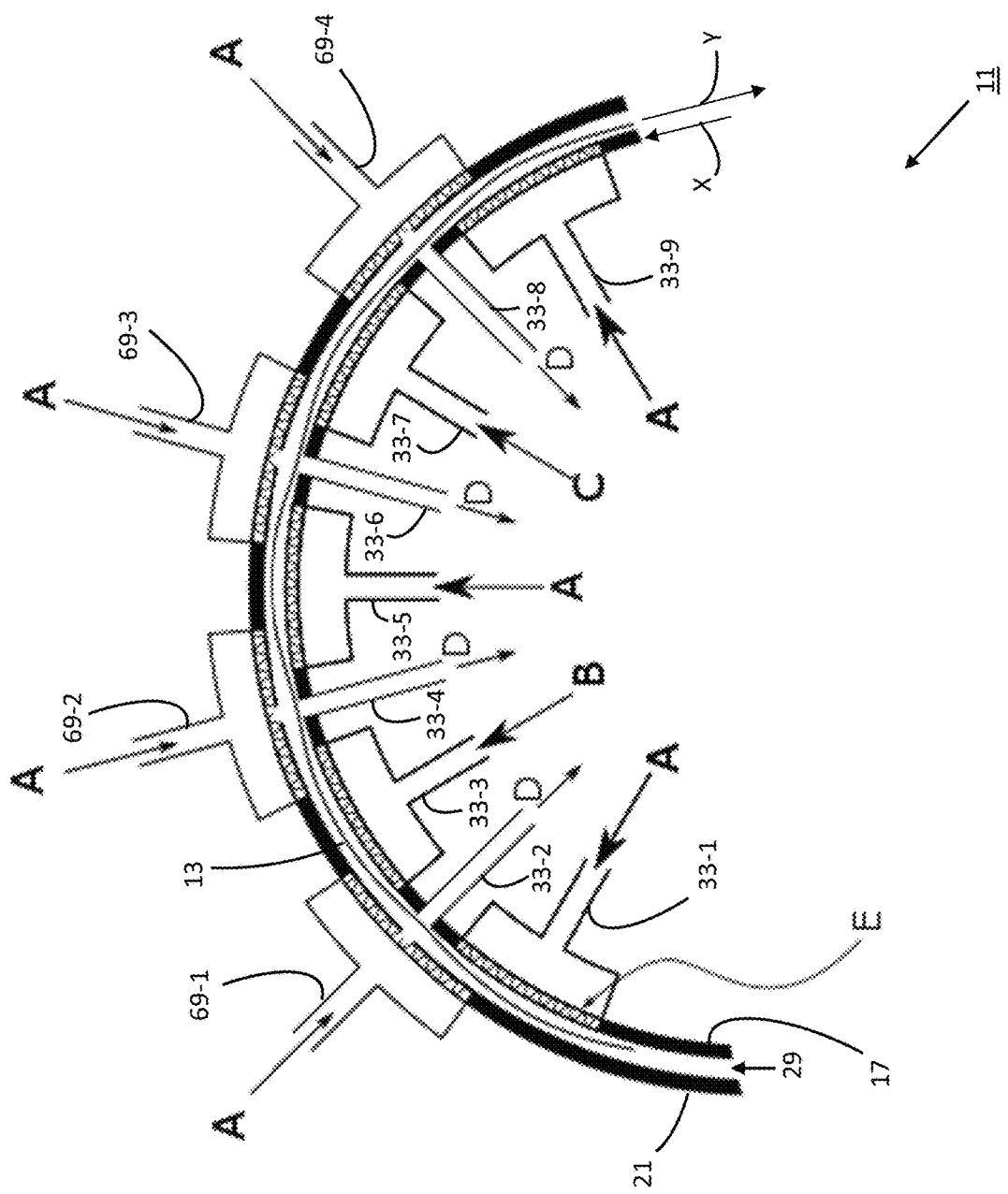
FIG. 11 is a simplified, fragmentary, cross-section view of the deposition drum, deposition head, and substrate shown in FIG. 8, the drawing being provided to illustrate an example of an atomic layer deposition process applied to a continuous web using the ALD system of the present invention.

With the spacing of gap 29 adjusted and set, atomic layer deposition can be performed. Referring now to FIG. 11, there is shown a simplified, fragmentary, cross-section view of deposition drum 17 and deposition head 21, the drawing being provided to illustrate an example of an atomic layer deposition process which can be applied to a continuous web 13 using ALD system 11 of the present invention. Together, deposition drum 17 and deposition head 21 define uniform gap 29 in which a second of web-like substrate 13 is shown.

As can be seen, deposition head 21 utilizes four separate fluid channels 61-1 thru 61-4 in communication with gap 29. In a similar fashion, deposition drum 17 utilizes nine separate fluid channels 33-1 thru 33-9 in communication with gap 29.

With head 21 remaining stationary, drum 17 rotates in the counterclockwise direction, as represented by arrow X. At the same time, web 13 advances in the clockwise direction, as represented by arrow Y.

In the present example, a first precursor B is introduced into gap 29 and onto substrate 13 through fluid channel 33-3 in drum 17. To create a buffer and thereby limit growth of precursor B to a first confined region of substrate 13, an inert gas A is continuously introduced into gap 29 through channels 69-1 and 69-2 in head 21 and channels 33-1 and 33-5 in drum 17 (I.e., surrounding the delivery of first precursor B). In the present design, fluid channels 33-2 and 33-4 are designated to exhaust excess precursor B and gas A from gap 29.

At the same time, a second precursor C is introduced into gap 29 upstream from the first region of substrate 13 through fluid channel 33-7 in drum 17. To create a buffer around second precursor C and thereby prevent interaction with precursor B, inert gas A is continuously introduced into gap through channels 69-3 and 69-4 in head 21 and channels 33-5 and 33-9 in drum 21. Fluid channels 33-6 and 33-8 are designated to exhaust excess precursor C and gas A from gap 29.

It should be noted that the specific configuration and utilization of inert gas A in the above-described deposition process introduces a number of notable advantages.

As a first advantage, the continuous delivery of inert gas A into gap 29 from channels 69-1 thru 69-4 in head 21 as well as channels 33-1, 33-3, and 33-5 in drum 17 effectively creates an air bearing between deposition drum 17 and deposition head 21. The presence of an air bearing enables substrate 13 to float within gap 29 and thereby minimize the risk of any web deformation.

As a second advantage, the particular arrangement, or location, of fluid channels 33 and 59 utilized to deliver inert gas A into gap 29 serves to create an effective double-sided buffer around each of the various precursors applied onto substrate 13. As a result, each precursor deposition stage is effectively isolated, which is a principal object of the present invention.

As a third advantage, the continual introduction and exhausting of inert gas A can be utilized to precisely initiate and terminate the period of precursor delivery onto a section of substrate 13. More specifically, by introducing inert gas A into gap 29 at a higher rate of delivery than precursors B and C, each precursor deposition stage can be precisely controlled. For instance, in the present example, as drum rotates counterclockwise, the direct angular alignment of channel 69-3 with channel 33-7 will effectively shut-off delivery of precursor C, since inert gas A is delivered into gap 29 with more pressure than precursor C. Thereafter, once drum 17 rotates channel 33-7 out of direct angular alignment with channel 69-3, precursor C can then be re-delivered into gap 29. Delivery of precursor C resumes until channel 33-7 is disposed in direct angular alignment with channel 69-2 in stationary head 21.

Through acute registration of the rotational rate of drum 17 relative to the advancement of substrate 13, the number of ALD cycles applied onto substrate can be varied, as needed. Therefore, an alternating sequence of thin film materials can be deposited on substrate 13 at relatively high speeds in a manner that suits the needs of the intended application.

The invention described in detail above is intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A system for depositing atomic-level layers of material onto a common substrate, the system comprising:

(a) a deposition drum having a longitudinal axis, the deposition drum adapted to rotate about the longitudinal axis;

(b) a deposition head shaped to define an interior cavity into which the deposition drum is positioned, the deposition head being spaced away from the deposition drum so as to define a narrow gap therebetween, the narrow gap being adapted to receive the common substrate; and (c) a pair of rollers coupled to the deposition head, the pair of rollers being adapted to transport the substrate through the gap defined between the deposition head and the deposition drum;

(d) wherein the deposition drum, the pair of rollers, and the interior cavity of the deposition head have conical configurations with the same angle of conical taper, with each of the pair of rollers being oriented in the opposite direction from the deposition drum and the interior cavity of the deposition head;

(e) wherein the narrow gap between the deposition head and the deposition drum has a spacing which is adjustable.

2. The system of claim 1 wherein the spacing of the narrow gap is adjustable through axial displacement of one of the deposition drum and the deposition head relative to the other of the deposition drum and the deposition head.

3. The system of claim 2 wherein the deposition head is axially displaced relative to the deposition drum to adjust the spacing of the narrow gap.

4. The system of claim 1 wherein the deposition drum comprises a first set of separate fluid channels in fluid communication with the narrow gap.

5. The system of claim 4 wherein the deposition head comprises a second set of separate fluid channels in fluid communication with the narrow gap.

6. The system of claim 5 wherein the deposition drum comprises:

(a) a hollow drum core which includes the first set of separate fluid channels; and (b) a hollow sleeve coaxially mounted over the drum core, the sleeve being shaped to define a plurality of orifices, with a selection of the plurality of orifices in fluid communication with each of the first set of separate fluid channels.

7. The system of claim 6 wherein the hollow drum core has a conical outer surface and the hollow sleeve has a conical interior surface, the conical outer surface of the core matching the conical interior surface of the sleeve.

8. The system of claim 7 wherein the deposition drum further comprises a heat source mounted within the drum core in fluid communication with each of the first set of fluid channels.

9. The system of claim 7 wherein the drum core comprises a widened rear end, a narrowed front end, an inner surface, and the conical outer surface.

10. The system of claim 9 wherein each of the first set of separate fluid channels extends through the drum core from the widened rear end and out through the conical outer surface.

11. The system of claim 7 wherein a valve is disposed within each of the plurality of orifices.

12. The system of claim 11 wherein the plurality of orifices is arranged into multiple co-linear sets.

13. The system of claim 5 wherein the deposition head comprises a lower shell and an upper shell which are coupled together and define the interior cavity.

14. The system of claim 13 wherein the lower shell has a top surface with a radial curvature that is adjustable.

15. The system of claim 1 further comprising a temperature-resistant carrier sheet which is adapted to support the common substrate.

16. A system for depositing atomic-level layers of material onto a common substrate, the system comprising:
   (a) a deposition drum having a longitudinal axis, the deposition drum adapted to rotate about the longitudinal axis, the deposition drum comprising,
      (i) a first set of separate fluid channels,
      (ii) a second set of separate fluid channels,
      (iii) a hollow drum core which includes the first set of separate fluid channels, the hollow drum core having a conical outer surface,
      (iv) a hollow sleeve coaxially mounted over the drum core, the hollow sleeve having a conical interior surface, the conical outer surface of the core matching the conical interior surface of the sleeve, the sleeve being shaped to define a plurality of orifices with a valve disposed within each of the plurality of orifices, the plurality of orifices being arranged into multiple co-linear sets, wherein a selection of the plurality of orifices is in fluid communication with each of the first set of separate fluid channels, and
      (v) a plurality of gaskets disposed between the drum core and the sleeve, with one of the plurality of gaskets circumscribing each co-linear set of orifices in the sleeve; and
   (b) a deposition head shaped to define an interior cavity into which the deposition drum is positioned, the deposition head being spaced away from the deposition drum so as to define a narrow gap therebetween, each of the first and second sets of separate fluid channels being in communication with the narrow gap, the narrow gap being adapted to receive the common substrate;
   (c) wherein the narrow gap has a spacing which is adjustable.

17. A system for depositing atomic-level layers of material onto a common substrate, the system comprising:
   (a) a deposition drum having a longitudinal axis, the deposition drum adapted to rotate about the longitudinal axis, the deposition drum comprising,
      (i) a first set of separate fluid channels, and
      (ii) a second set of separate fluid channels; and
   (b) a deposition head shaped to define an interior cavity into which the deposition drum is positioned, the deposition head being spaced away from the deposition drum so as to define a narrow gap therebetween, each of the first and second sets of separate fluid channels being in communication with the narrow gap, the narrow gap being adapted to receive the common substrate, wherein the narrow gap has a spacing which is adjustable, the deposition head comprising,
      (i) a lower shell, the lower shell having a top surface with a radial curvature that is adjustable, the lower shell being shaped to define a relief slot having a spacing which is adjustable, and
      (ii) an upper shell, the lower shell and the upper shell being coupled together and defining the interior cavity.

18. The system of claim 17 wherein adjustment of the spacing of the relief slot in the lower shell adjusts the radial curvature of the top surface of the lower shell.

\* \* \* \* \*